United States Patent [19]
Lee

[11] Patent Number: 6,084,312
[45] Date of Patent: Jul. 4, 2000

[54] SEMICONDUCTOR DEVICES HAVING DOUBLE PAD STRUCTURE

[75] Inventor: Young-woo Lee, Kyungki-do, Rep. of Korea

[73] Assignee: Samsung Electronics Co., Ltd., Suwon, Rep. of Korea

[21] Appl. No.: 09/182,199

[22] Filed: Oct. 30, 1998

[51] Int. Cl.[7] .................................................. H01L 23/48
[52] U.S. Cl. ........................ 257/786; 257/737; 257/738; 257/773; 257/780; 257/781; 257/784
[58] Field of Search .................................... 257/738, 748, 257/773, 784, 786, 737, 781, 780; 438/614, 611, 612, 613, 615

[56] References Cited

U.S. PATENT DOCUMENTS

| | | | |
|---|---|---|---|
| 4,017,886 | 4/1977 | Tomono et al. | 257/643 |
| 4,948,754 | 8/1990 | Kondo et al. | 438/613 |
| 5,248,903 | 9/1993 | Heim | 257/748 |
| 5,284,797 | 2/1994 | Heim | 438/612 |
| 5,404,047 | 4/1995 | Rostoker et al. | 257/786 |
| 5,463,255 | 10/1995 | Isono | 257/773 |
| 5,696,406 | 12/1997 | Ueno | 257/784 |
| 5,751,065 | 5/1998 | Chittipeddi et al. | 257/758 |
| 5,767,010 | 6/1998 | Mis et al. | 438/614 |

FOREIGN PATENT DOCUMENTS

| | | |
|---|---|---|
| 60-134037 | 6/1985 | Japan . |
| 61-187262 | 8/1986 | Japan . |
| 61-225837 | 10/1986 | Japan . |
| 63-277655 | 11/1988 | Japan . |
| 5-251497 | 9/1993 | Japan . |

*Primary Examiner*—Olik Chaudhuri
*Assistant Examiner*—Alonzo Chambliss
*Attorney, Agent, or Firm*—Jones Volentine, L.L.P.

[57] ABSTRACT

A semiconductor device having a double pad structure, and a method of manufacturing the same, allows a pad size required for a wire-bonding or a ball-bonding process with highly-integrated semiconductor devices to be obtained. The semiconductor device having a double pad structure includes a cell-portion having a certain circuit pattern on a semiconductor substrate and a peri-portion having a plurality of pads formed around the cell-portion for the electrical contact of the certain circuit pattern with the outside circuits. The semiconductor device further includes: an intermediate insulating layer formed on the semiconductor substrate; an uppermost metallic conductive pattern formed on the intermediate insulating layer within the cell-portion; a first pad pattern formed on the intermediate insulating layer within the peri-portion and preferably being made of a same material as the uppermost metallic conductive pattern; a passivation layer formed throughout the semiconductor substrate for a portion of the first pad patterns to be exposed; and a second pad pattern formed on the passivation layer including the exposed portion of each of the first pad pattern, the size of a pad of the second pad pattern being bigger than that of the first pad pattern. Preferably, the second pad pattern extends over the cell region.

6 Claims, 4 Drawing Sheets

SEMICONDUCTOR DEVICES HAVING DOUBLE PAD STRUCTURE

BACKGROUND OF THE INVENTION

1. Field of the Invention

The present invention relates to semiconductor devices having double pad structure, a method of manufacturing the same, and a semiconductor package formed thereby, and more particularly, to semiconductor devices having double pad structure for providing sufficient pad size required for a bonding process with outside circuits even with the decreased size of the semiconductor chips, a method of manufacturing the same, and a semiconductor package formed thereby.

2. Description of the Related Art

Semiconductor device fabrication processing involves various processes for a semiconductor wafer such as deposition, oxidation, photo-etch, etc., which are repeatedly carried out so that a pre-designed specific pattern is formed on the semiconductor wafer. Finally, by forming specific metallic conductive lines on the uppermost layer on the semiconductor wafer, covering the surface of the semiconductor wafer with a passivation layer in order to prevent the insulation with the outside, and the contamination from the outside, opening a pad layer thereon for the electrical communication contact, and dicing along the scribe line on the semiconductor wafer, each of the semiconductor chips is fabricated.

Referring to FIGS. 1 and 2, a conventional semiconductor chip fabrication process is illustrated in detail.

FIG. 1 is a top view showing a single chip fabricated by the conventional method, the semiconductor chip 10, which is cut out of the semiconductor wafer, is composed of a cell portion 16 on its center with a pre-set circuit pattern thereon and a peri-portion 14 on its peripheral area with a pad 12 for the electrical contact with outside circuits, and specific control elements. The pad 12 on the peri-portion 14, as shown in FIG. 1, can be of several types including a quad type with the pads formed along the four sides of the semiconductor chip 10, or a dual type with pads formed on any two sides thereof, etc.

FIG. 2 is a cross-sectional view showing the region taken along the line II—II of FIG. 1. The description of the semiconductor device fabrication process including the formation of the pad is made with reference to FIG. 2. A specific intermediate insulating layer 20 is formed on a semiconductor substrate (not shown), and an uppermost metallic conductive layer 17 is formed on the intermediate insulating layer 20 for the circuit pattern by means of a typical deposition, and photo-etch process, etc. within the cell-portion 16. Typically, a pad layer 18 is formed on the peri-portion 14 simultaneously with the formation of the metallic conductive layer 17 using the same material as the metallic conductive layer 17, e.g., aluminum.

Then, a passivation layer 22 is formed over the semiconductor substrate with the metallic conductive layer 17 and the pad layer 18. That is, by forming the passivation layer, e.g., an insulating oxide layer, by carrying out photo-etch process so as to expose the pad layer 18, and carrying out dicing, a single semiconductor chip 10 is formed.

Then, a package process is carried out so as to bond the semiconductor chip 10 with a printed circuit substrate having outside circuits thereon. The package process may be one of several types, e.g., a wire-bonding process of connecting the lead of a lead frame with the exposed pad on the semiconductor chip using wire, or a ball-bonding process of forming a ball on the pad of the semiconductor chip, and bonding with the printed circuit substrate.

However, the above wire-bonding or the ball-bonding process for the electrical contact with the outside circuits requires a pad having a certain minimum size, irrespective of the recent trend of the highly-integrated semiconductor devices. The number of the pads formed on a single chip and the number of the semiconductor chips formed from a single semiconductor wafer are increasing with the high-integration and the sophistication of the semiconductor devices, while the size of a single semiconductor chip is decreasing. In other words, the size of the pad should be made over a certain threshold even with the decrease of the single chip size, and the increase in the number of pads. As a result, a new pad structure is required in order to overcome the above problems.

Further, as shown in FIG. 2, the covering of the passivation layer 22 for opening the pad layer 18 in the conventional pad formation process includes a dry-etch process, but the surface of the pad layer 18 can be damaged by the plasma during the dry-etch process. Contamination can also occur. Either result in the malfunctioning in the subsequent bonding process.

SUMMARY OF THE INVENTION

The present invention is directed to providing a semiconductor device and a method of manufacturing the same for obtaining a pad size required for a wire-bonding or a ball-bonding process with the highly-integration of semiconductor devices, which substantially obviates one or more of the problems due to the limitations and the disadvantages of the related art.

Another object of the present invention is to provide a semiconductor device and a method of manufacturing the same for preventing damage and contamination of the pad surface which can occur during the etching process for the formation of the pad.

A further object of the present invention is to provide a semiconductor package using the semiconductor devices manufactured by the present invention.

To achieve these and other advantages and in accordance with the purposes of the present invention as embodied and broadly described, the method of manufacturing a semiconductor device having double pad structure with a cell-portion having a certain circuit pattern on a semiconductor substrate, and a peri-portion having a plurality of pads formed around the cell-portion for the electrical contact of the certain circuit pattern with the outside circuits, the method including: forming an uppermost metallic conductive pattern of the cell-portion and a first pad pattern of the plurality of pads of the peri-portion on a certain intermediate insulating layer on the semiconductor substrate simultaneously; forming a passivation layer over the surface of the semiconductor substrate having the uppermost metallic conductive pattern and the first pad pattern formed thereon; exposing a portion of the first pad pattern by removing a portion of the passivation layer; forming a conductive material layer throughout the surface of the semiconductor substrate having the exposed first pad pattern formed thereon; and forming a second pad pattern on the exposed first pad pattern by removing a portion of the conductive material layer, the size of a pad in the second pad pattern being bigger than the size of a pad in the first pad pattern.

A ball-bonding, or wire-bonding can be performed on the second pad pattern for the electrical contact with the outside circuits after the step of forming a second pad pattern.

A semiconductor device having a double pad structure with a cell-portion having a certain circuit pattern on a semiconductor substrate, and a peri-portion having a plurality of pads formed around the cell-portion for the electrical contact of the certain circuit pattern with the outside circuits, the semiconductor device including: an intermediate insulating layer formed on the semiconductor substrate; an uppermost metallic conductive pattern formed on the intermediate insulating layer within the cell-portion; a plurality of first pad patterns formed on the intermediate insulating layer within the peri-portion and being made of a same material as the uppermost metallic conductive pattern; a passivation layer formed over the semiconductor substrate for a portion of the first pad pattern to be exposed; and a second pad pattern formed on the passivation layer including the exposed portion of each of the first pad pattern, the size of a pad of the second pad pattern being bigger than that the size of a pad of the first pad pattern.

The first pad pattern and the second pad pattern may be made of same material, e.g., aluminum. The second pad pattern can be extended over the passivation layer of the cell-portion.

In another aspect of the present invention, a semiconductor package including a semiconductor chip having a cell-portion having a certain circuit pattern on a semiconductor substrate, and a peri-portion having a plurality of pads formed around the cell-portion and a connector connected with the pads for the electrical contact of the circuit pattern with outside circuits. The semiconductor chip includes: an intermediate insulating layer formed on the semiconductor substrate; an uppermost metallic conductive pattern formed on the intermediate insulating layer within the cell-portion; a first pad pattern formed on the intermediate insulating layer within the peri-portion and being made of a same material as the uppermost metallic conductive pattern; a passivation layer formed over the semiconductor substrate with a portion of the first pad patterns exposed therethrough; and a second pad pattern formed on the passivation layer including the exposed portion of each of the first pad pattern, the size of a pad of the second pad pattern being bigger than that of the first pad pattern.

The connector may be a ball for ball-bonding directly with a printed circuit substrate having the outside circuits, or a lead frame for bonding with a printed circuit substrate having the outside circuits.

It is to be understood that both the foregoing general description and the following detailed description are exemplary and explanatory and are intended to provide further explanation of the invention as claimed.

DETAILED DESCRIPTION OF THE PREFERRED EMBODIMENTS

The present invention now will be described more fully hereinafter with reference to the accompanying drawings, in which preferred embodiments of the invention are shown. This invention may, however, be embodied in many deferent forms and should not be construed as limited to the embodiments set forth herein; rather, these embodiments are provided so that this disclosure will be thorough and complete, and will fully convey the scope of the invention to those skilled in the art.

Figure 1:
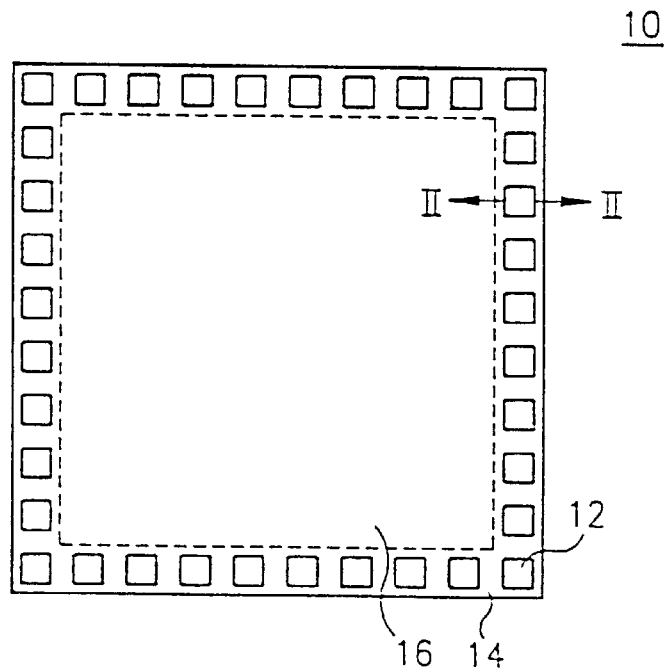
FIG. 1 is a top view showing a single chip fabricated by the conventional method.
Figure 3:
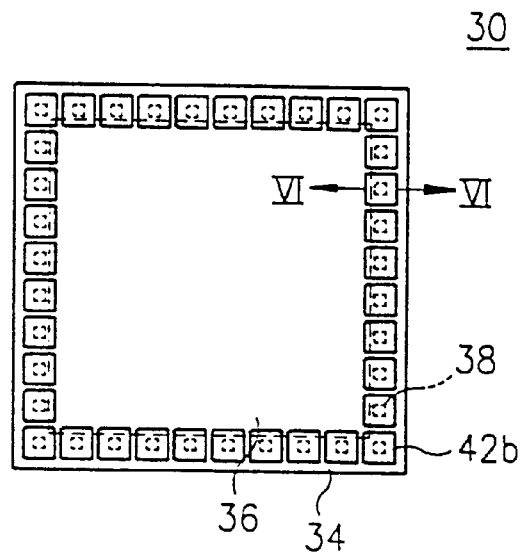
FIG. 3 is a top view showing a single chip having a double pad structure fabricated according to one embodiment of the present invention.

FIG. 3 is a top view of the semiconductor chip 30 manufactured according to one embodiment of the present invention. Compared with the semiconductor chip 10 of the FIG. 1, the chip size is reduced by 70%. Along each side of the semiconductor chip 30, there are formed ten pads in a second pad pattern 42b corresponding to the pads 12 of the FIG. 1. Each pad is spaced apart from each other with a certain distance. The number and size of the pads in the second pad pattern 42b are the same as that of the pad 12 of the FIG. 1.

In addition, the semiconductor chip 30 is also composed of a cell-portion 36 on its center having a pre-set circuit pattern of the semiconductor device thereon and a peri-portion 34 having pads or certain control elements around the cell-portion for the electrical contact with the outside circuits.

As shown in FIG. 3, the semiconductor chip 30 has a double pad structure, which includes the second pad pattern 42b, indicated by the solid lines, and a first pad pattern 38, indicated by the phantom lines inside the second pad pattern 42b. Pads in the second pad pattern 42b may be extended into the cell-portion 36. This extension allows the size of the pad to be bonded with outside circuits to remain at least the minimum required size, while reducing the size of the peri-portion 34 of the semiconductor chip 30.

The size of the semiconductor chip 30, and the size, the number, and the shape of the pads shown in FIG. 3 merely serve as in example, and in practice are set according to a desired application of the present invention.

Figure 4:
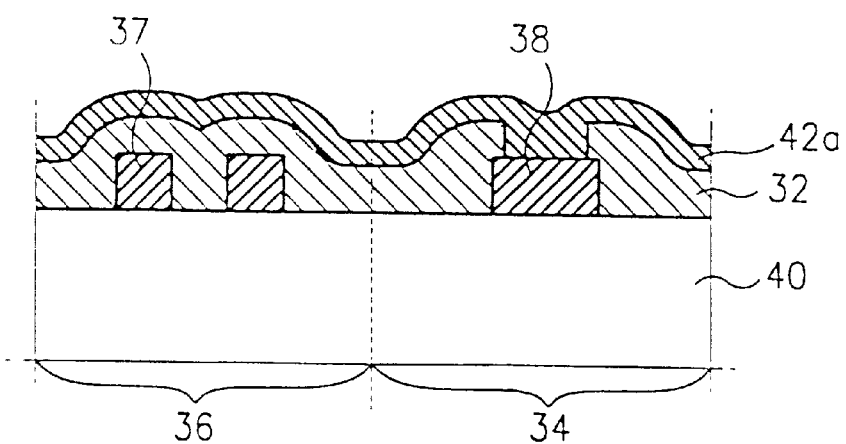
FIGS. 4 to 6 are cross-sectional views illustrating the steps of the method of fabricating the double pad structure according to one embodiment of the present invention, with FIG. 6 illustrating the double pad structure of the chip in FIG. 3 taken along the line VI—VI of FIG. 3.
Figure 5:
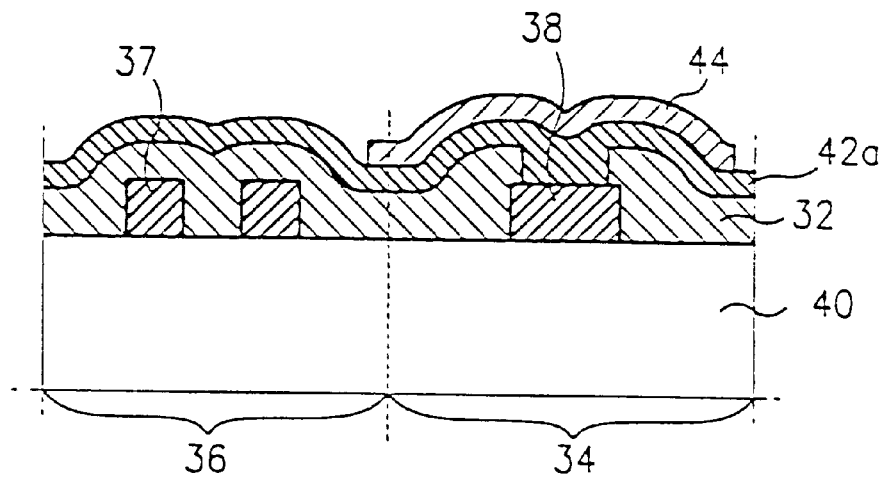
Figure 6:
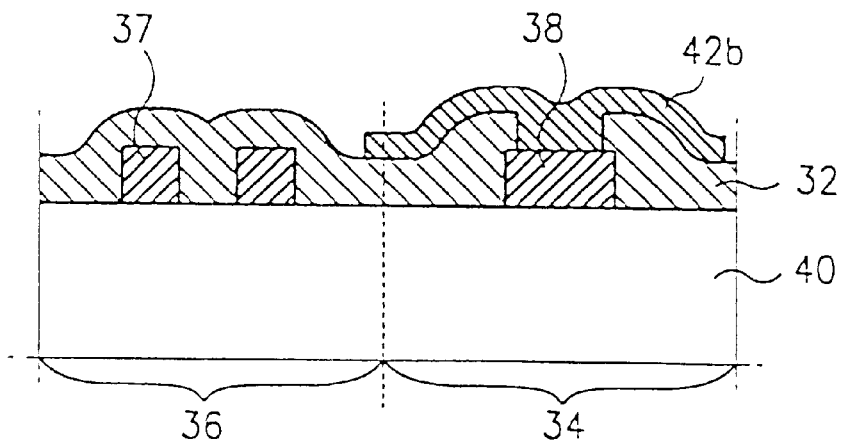

FIGS. 4 to 6 are cross-sectional views illustrating the steps of fabricating a semiconductor chip having the double pad structure taken along the line IV—IV of the FIG. 3 according to one embodiment of the present invention.

Figure 2:
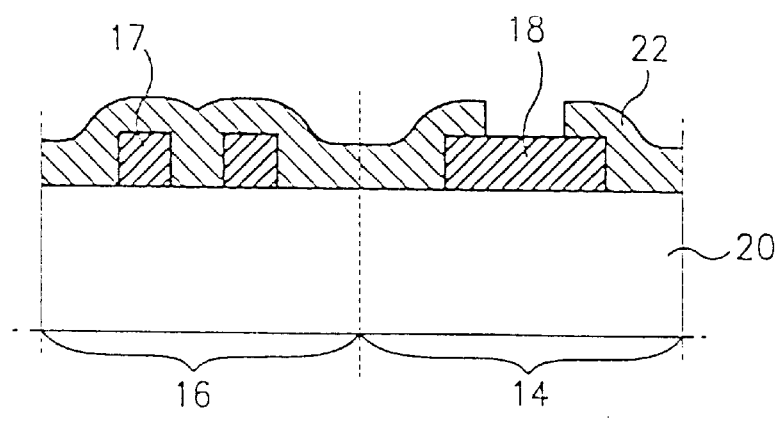
FIG. 2 is a cross-sectional view showing the region taken along the line II—II of FIG. 1.

Referring to FIG. 4, the method of fabricating the double pad structure is the same as that of FIG. 2 until the step of opening the pad. That is, the method of manufacturing a semiconductor device for forming a pre-designed circuit pattern on a semiconductor substrate (not shown) is processed by forming a specific intermediate insulating layer 40 on the semiconductor substrate, and forming a uppermost metallic conductive layer 37, e.g., a conductive material such as aluminum, for the circuit pattern on the intermediate insulating layer 40 within the cell-portion 36 by means of a typical deposition and photo-etch process, etc. At this stage, generally, a first pad pattern 38 is formed on the peri-portion 34 simultaneously with the formation of the metallic conductive layer 37, and the first pad pattern 38 is made of the same material of the metallic conductive layer 37, e.g., aluminum.

However, the structure being formed according to the method of the present invention differs from the conventional method shown in FIG. 2 in that the size of the first pad pattern 38 can be made smaller than the conventional pad layer 18. Thus, the size of the peri-portion 34 can be made reduced.

Then, a passivation layer 32, such as an insulating oxide layer, is formed on the whole surface of the semiconductor substrate having the metallic conductive layer 37 and the first pad pattern 38 formed thereon. A photo-etch process is then performed to expose a portion of the first pad pattern 38. Then, as shown in FIG. 4, a second pad pattern layer 42a, preferably being of the same material as the first pad pattern 38, e.g., aluminum, is formed on the whole surface of the semiconductor substrate.

Sequentially, referring to FIG. 5, photoresist is coated on the second pad pattern layer 42a, and a photoresist pattern 44 is formed over the first pad pattern 38 by means of typical photo-etch process.

Then, referring to FIG. 6, the second pad pattern 42b with a certain size is formed by etching the second pad pattern layer 42a using the photoresist pattern 44 as an etch-mask. Unlike the conventional method, according to the present invention, the photoresist pattern 44 serves as etch-mask so that the second pad pattern layer 42a is etched and the second pad pattern 42b having a certain size is formed. As a result, because the photoresist pattern 44 serves as etch-mask for its underlaying second pad pattern layer 42a, there are no concerns of damage and contamination. In contrast, the pads shown in FIG. 2 were damaged due to the plasma generated during the etch process, or were contaminated by outside contaminants. Therefore, by coating the upper side including the first pad pattern 38 and a portion of passivation layer 32 including its exposed portion with the second pad layer 42a, the second pad pattern 42b is formed over the passivation layer 32, thereby obtaining a double pad structure. Then, a single semiconductor chip may be created by dicing the wafer.

The second pad pattern 42b is the portion where a ball or a wire directly contacts, as the connector for the electrical contact with the outside circuits associated with the following package process. Pads of the second pattern 42b can extend beyond the peri-portion 34 into the cell-portion 36, as shown in FIGS. 3 and 6.

While the present embodiment shows a double pad structure including the first pad pattern 38 and the second pad pattern 42b, but if necessary, three, or more pad structures can be formed, which is well understood by those skilled in the art.

Figure 7:
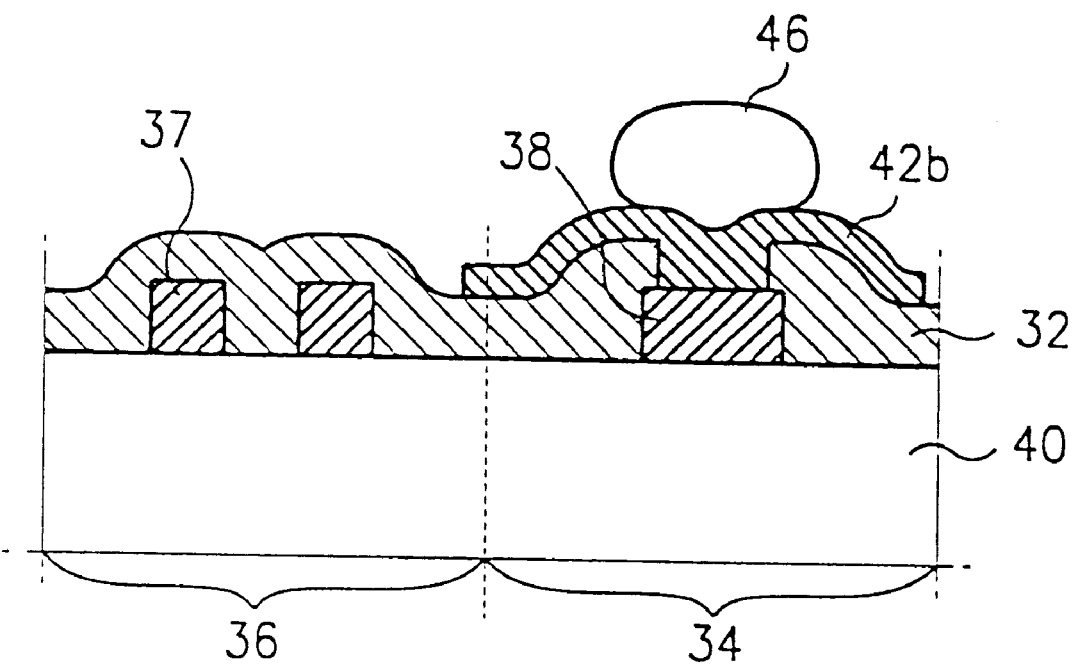
FIG. 7 is a cross-sectional view showing one portion of the semiconductor package having a connector formed on the double pad structure according to one embodiment of the present invention.

FIG. 7 is a cross-sectional view illustrating a subsequent package process for the single semiconductor chip of the FIG. 6. Referring to FIG. 7, in particular, showing the ball bonding process for the connection of the semiconductor chip and a printed circuit substrate (not shown) having outside circuits thereon, a ball 46 is formed on the second pad pattern 42b. The formation of the ball 46 is accomplished by putting lead, aluminum, or copper, or any appropriate connecting material, on a portion of the surface of the second pad pattern 42b, and heating the material over a temperature of its melting point. This results in the material being formed as ball by the surface tension of the material on the second pad pattern 42b, which is the most stable shape. Then, by aligning the ball 46 formed as above, and a specific portion of the printed circuit substrate, and heating, the semiconductor chip can be bonded on the printed circuit substrate with stability and ease.

As illustrated, the package process including a ball-bonding process in the present embodiment, the ball 46 and the wire of a wire-bonding process can be used the second pad pattern to the external circuits. Alternatively, the semiconductor package can be made by bonding the lead frame of the wire-bonding process and the second pad pattern 42b, which is apparent to those skilled in the related art.

As described above, the present invention allows the formation of a pad having a sufficient size for use with the bonding in the package process is stably carried out even with the decreased size of the single chip and the increased number of the pads thereon for a highly-integrated semiconductor device.

Furthermore, according to the present invention, the damage on the pads caused by the plasma during the formation of the second pad pattern 42b can be prevented, and contaminants from the outside are blocked so that the bonding in the following bonding process can be done perfectly.

It will be apparent to those skilled in the art that various modifications and variations of the present invention can be made without departing from the spirit or scope of the invention. Thus, it is intended that the present invention covers the modifications and variations of this invention provided they come within the scope of the appended claims and their equivalents. Therefore, it is intended that the present invention not be limited to the particular embodiment disclosed, but that the present invention include all embodiments falling within the scope of the appended claims.

What is claimed is:

1. A semiconductor device having a double pad structure with a cell-portion having a certain circuit pattern on a semiconductor substrate, and a peri-portion having a plurality of pads formed around the cell-portion for the electrical contact of the certain circuit pattern with the outside circuits, the semiconductor device comprising:

an intermediate insulating layer formed on the semiconductor substrate;

an uppermost metallic conductive pattern formed on the intermediate insulating layer within the cell-portion;

a first pad pattern formed on the intermediate insulating layer within the peri-portion;

a passivation layer formed over the semiconductor substrate with a portion of the first pad pattern being exposed through the passivation layer; and a second pad pattern formed on the passivation layer including the exposed portion of the first pad pattern, a size of a pad of the second pad pattern being bigger than that of the first pad pattern, the second pad pattern extending over the passivation layer of the cell-portion.

2. The semiconductor device having a double pad structure of the claims 1, wherein the first pad pattern and the second pad pattern are made of the same material.

3. The semiconductor device having a double pad structure of the claim 2, wherein the first pad pattern and the second pad pattern are made of aluminum.

4. The semiconductor device having a double pad structure of the claim 1, wherein the first pad pattern and the uppermost metallic conductive pattern are made of the same material.

5. The semiconductor device having a double pad structure of the claim 1, wherein the passivation layer is an insulating oxide layer.

6. A semiconductor package including a semiconductor chip having a cell-portion having a certain circuit pattern on a semiconductor substrate, and a peri-portion having a plurality of pads formed around the cell-portion; and a connector connected with the pads for electrical contact of the certain circuit pattern with outside circuits, wherein the semiconductor chip comprises:

an intermediate insulating layer formed on the semiconductor substrate;

an uppermost metallic conductive pattern formed on the intermediate insulating layer within the cell-portion;

a first pad pattern formed on the intermediate insulating layer within the peri-portion;

a passivation layer formed over the semiconductor substrate with a portion of the first pad pattern being exposed through the passivation layer; and a second pad pattern formed on the passivation layer including the exposed portion of the first pad pattern, a size of a pad of the second pad pattern being bigger than that of the first pad pattern, the second pad pattern extending over the passivation layer on the cell-portion.

* * * * *